United States Patent [19]

Tamori

[11] Patent Number: 5,429,006
[45] Date of Patent: Jul. 4, 1995

[54] SEMICONDUCTOR MATRIX TYPE SENSOR FOR VERY SMALL SURFACE PRESSURE DISTRIBUTION

[75] Inventor: Teruhiko Tamori, Iruma, Japan

[73] Assignee: Enix Corporation, Japan

[21] Appl. No.: 15,392

[22] Filed: Feb. 9, 1993

[30] Foreign Application Priority Data

Apr. 16, 1992 [JP] Japan ................................. 4-122637

[51] Int. Cl.⁶ .............................................. G01L 1/00
[52] U.S. Cl. ............................ 73/862.046; 382/124
[58] Field of Search ............... 73/105, 862.046, 865.7; 356/71; 382/4, 5

[56] References Cited

U.S. PATENT DOCUMENTS

| | | | |
|---|---|---|---|
| 3,781,855 | 12/1973 | Killen | 382/4 |
| 4,429,413 | 1/1984 | Edwards | 382/4 |
| 4,547,898 | 10/1985 | Tsikos | 382/4 |
| 4,577,345 | 3/1986 | Abramov | 382/4 |
| 5,079,949 | 1/1992 | Tamori | 73/172 |

Primary Examiner—Richard E. Chilcot, Jr.
Assistant Examiner—R. Biegel
Attorney, Agent, or Firm—Laff, Whitesel, Conte & Saret, Ltd.

[57] ABSTRACT

An analog finger print reader comprises a matrix of electronic switches selectively controlled from a matrix of individually associated electrodes. A thin film having a conductive surface is suspended over the electrodes to apply control potentials to the electrodes in response to the pressure applied by a mountain in the pattern of a finger print (a ridge is viewed as a string of mountains). The area of contact between the conductive film and the electrode varies as an analog of the amount of applied pressure. Shift registers scan the electrodes to identify the address of a finger print mountain which is turning on the associated electronic switch. A detector responds to the address by giving an output which is an analog of the area of contact and, therefore, of the amount of applied pressure. The entire unit is built on a semiconductor substrate. Thus, the amount of wiring is greatly reduced. The reader is a unified device made with the precision of an integrated circuit.

10 Claims, 7 Drawing Sheets

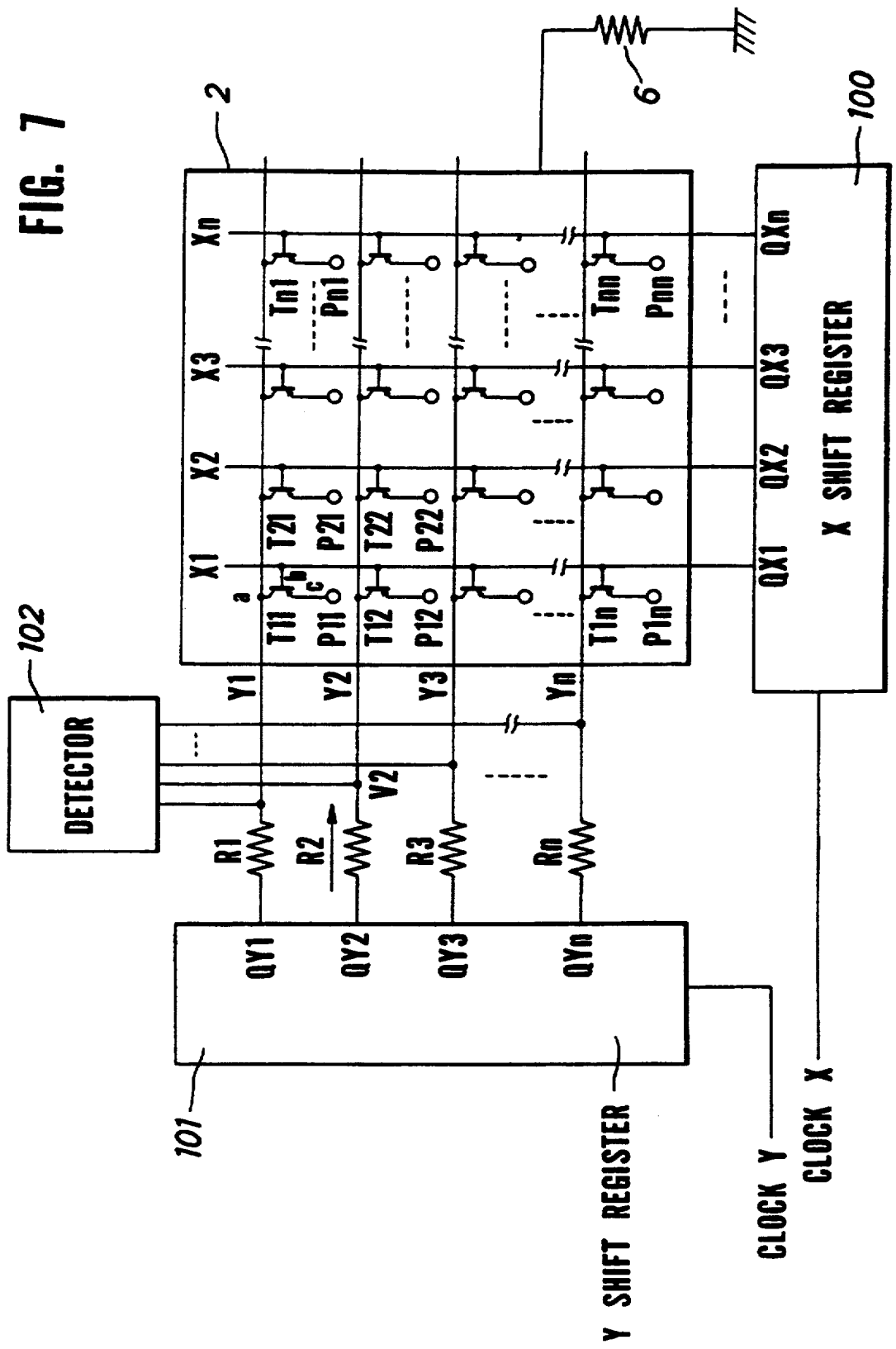

SEMICONDUCTOR MATRIX TYPE SENSOR FOR VERY SMALL SURFACE PRESSURE DISTRIBUTION

BACKGROUND OF THE INVENTION

This invention relates to semiconductor matrix types of sensors for detecting very small surface pressure distribution. More particularly, the invention relates to semiconductor elements for detecting minute distances between fine pressure distributions, such as might occur responsive to the pressure differentials resulting from the valleys and ridges of a finger print.

The following is a description of conventional finger print detectors or readers. In one apparatus, a finger tip is brought into contact with one surface of a prism which is irradiated by light, with the reflected light reverberating on a surface of a photo-detector element such as a CCD. As a result, a finger print pattern is detected in accordance with an output signal from the photo-detector element. However, this optical system is susceptible to adverse influences such as those caused by sweat and moisture.

One cause of a false reading, might be a residue from the sweat of a person who previously measured his finger print may still remain on the surface of the prism to cause measurement errors, resulting in either inconvenience or false readings. In greater detail, the residue may absorb light irradiated from outside for measurement of a finger print. Because of the residue, there is little reflection of the light from the surface of the prism, resulting in failure of measurement of the finger print.

There may also be many other causes of false readings. A failure of the measurement of a finger print may not only be due to the residue from the sweat of a person who previously measured his finger print, but also may be a result of moisture from anywhere, such as ambient humidity, rain, or the like. Dryness may also cause false readings due to a failure of the measurement to correctly detect a total reflection of the light from the surface of the prism. Therefore, a finger print pattern cannot always be accurately detected by a light reading method.

In addition, this light reflection method requires a high power consumption; therefore, it is not suitable for outdoor measurements by battery powered equipment.

The inventor has previously described finger print detecting apparatus (Japanese Patent Laid-Open Application No. 63-204374) for reading finger prints responsive to pressure or contact differentials of surface pressure applied by ridges on the finger tip. According to this pressure reading apparatus, a change in the conductivity on a surface is caused by a difference between the top ("ridges") and bottom ("valleys") of the skin surface on the tip of a finger. The conductivity is detected by ON/OFF states responsive to using a combination of a scanning electrode matrix and conductive rubber having a conductivity which changes in accordance with pressure. This pressure reader is free from for the above-described problems associated with light reflection.

The inventor has also described a surface pressure distribution detecting element in Japanese Patent Application No. 2-179735 (now U.S. Pat. No. 5,079,947). In this element, scanning electrodes extending in one direction are formed on a hard substrate. Resistance films are formed on the scanning electrodes which are spaced apart by a predetermined pitch (50 to 100 $\mu$m). A flexible film has a lower surface extending over the scanning electrodes in a direction perpendicular to the direction in which the electrodes extend. A finger tip is pressed against the upper surface of the flexible film. As a result, the total resistance of the resistance films between the electrodes, which are perpendicular to each other, is changed in accordance with an areas in which the ridges of the skin surface are brought into contact with the resistance films.

The surface pressure distribution detecting element of U.S. Pat. No. 5,079,947 is free from the adverse influences caused by sweat and moisture. However, the described element has the following material, structural, and manufacturing problems. (1) as a practical matter, it is difficult to find a durable flexible film material which can accurately transmit the pressure distribution of the skin surface and which can assure a deposition of the scanning electrodes by an etching process or the like. (2) In the manufacturing process, it is very difficult to position the scanning electrodes to be exactly perpendicular to each other. (3) The pressure sensitivity of the element varies depending on the incremental surface positions that receive the pressure.

SUMMARY OF THE INVENTION

Accordingly an object of the invention is to provide new and improved means for detecting patterns of minute surface protrusions. In particular, an object is to detect the pattern of ridges in a finger print.

Another object of the invention is to provide a single device comprising an integrated chip which both detects the pattern of finger prints and outputs a suitable electrical signal representing the detected print.

Still another object of the invention is to reduce the cost of such detectors. In particular, an object is to eliminate many wires which were heretofore required for such detectors. Here an object is to reduce manufacturing costs while producing superior products.

According to the invention, an integrated circuit includes a large number of semiconductor switching elements which are arranged in a matrix form on a single semiconductor substrate. A flexible film has a conductive coating formed over and spaced away from the entire surface of the side which confronts the semiconductor substrate. The conductive coating is stretched adjacent the tip of the control electrodes which are exposed to measure the contact made by the ridges of finger prints which press the coating against the electrodes. The electrodes control the switching elements that causes them to switch on according to the finger print pattern. An electronic matrix scanning system scans the switching elements, point by point, to detect their switched state and therefore the presence/absence of a surface pressure at the control electrodes. The degree of contact between the electrodes and the conductive coating may also be measured to give an analog output.

Unlike a conventional arrangement, the alignment of the scanning electrodes is not necessary because there is no need to form opposing and perfectly aligned scanning electrodes because one electrode is formed as a conductive coating or film in the invention. No etching is required to form one of the electrodes. In addition, the high-precision of semiconductor fabrication may be used to manufacture the part of the sensor which is etched. As a result the sensor may be almost free from variations so that each point (20 μm ×20 μm) and pitch (60 μm) between the points have exact locations. There is no idea in conventional arrangements for extracting several ten of thousands of points of contact electrodes from a surface of a semiconductor substrate which are distributed at a very small pitch of several tens of μm.

In particular, when a complicated minute pattern, such as a finger print, must be measured with a very high precision, and when the measurement area has a size of about 13 mm×20 mm, it is possible to use the semiconductor material itself as the base substrate. In addition, peripheral circuits can also be incorporated on the same semiconductor substrate. Hence, the inventive sensor is free from the complicated wiring that is found in surface distribution types of sensors.

The inventive sensor can be a low-profile sensor which is suitable for a finger print detecting apparatus. The sensor can be used if an identification is required as, for example, in connection with a cash card or bankbook, thus greatly enhancing the industrial applicability of the invention.

In keeping with an aspect of the invention, an orthogonal array of semiconductor switching elements are formed in a matrix on a semiconductor substrate. The semiconductor switching elements may use GaAs FETS, MOSFETS, bipolar transistors, diodes, or the like. The elements are formed at a pitch of about 10 to 200 μm. Alternatively, a digital or analog circuit (such as an AND gate or an operational amplifier) may be used. Each switching element has an individually associate electrode terminal which is exposed above the surface of the semiconductor material. These terminals may provide either input or output for the switching elements, depending upon their nature.

A surface pressure distribution detector has a flexible film with a non-etched conductive coating formed over its entire surface. The coating of the flexible film surface confronts all of the electrodes on the semiconductor substrate, thus eliminating a need to align two etched sets of electrodes. The coating engages the electrodes at locations where pressure is applied by a ridge in a finger print.

In greater detail, when the flexible film receives an extremely low pressure, the depressed portion of the film is flexed and is put into conductive contact with an underlying electrode terminal of the semiconductor switching element which is individually associated with the depressed portion. As a result of the electrical contact between an electrode and the film, the associated switching element operates. Assuming that the terminal functions as an output terminal, voltages are sequentially output from the output terminals to enable detection of the voltages at the points where the conductive coating of the flexible film make contact with the terminals.

BRIEF DESCRIPTION OF DRAWINGS

A preferred embodiment of the invention will be described in detail in connection with the accompanying drawings, in which:

FIG. 7 is a block diagram of another system using the semiconductor matrix type small-surface pressure distribution sensor of FIG. 1 in combination with the FIG. 3 electrical matrix.

DETAILED DESCRIPTION

Figure 1:
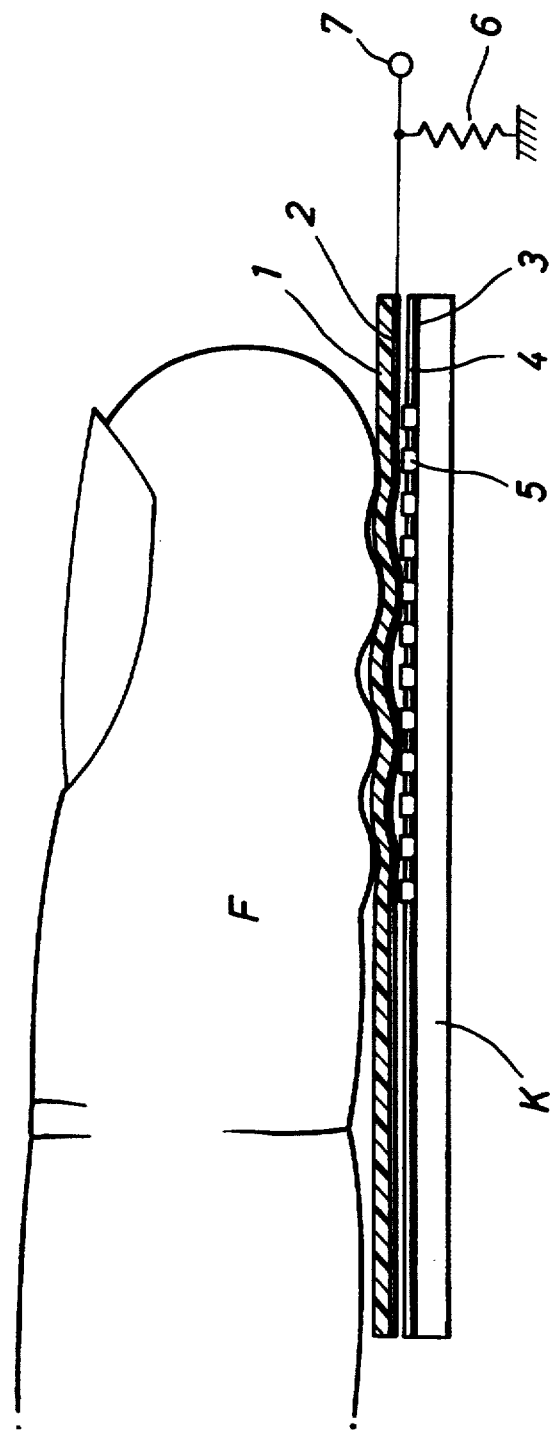
FIG. 1 is a partially cross sectional view of a semiconductor finger print sensor using the inventive arrangement of a semiconductor matrix type of small-surface, pressure distribution sensor.

A semiconductor matrix (FIG. 1) is able to detect small differentials of surface pressure. The components in FIG. 1 are: a human finger tip F; a film 1, a conductive coating 2 covering one entire side surface of film 1; a silicon oxide film 3; an insulating protective film 4; an output electrode 5; a detection resistor 6; and a detection terminal 7, which is connected to conductive coating 2.

In this finger print sensor, a detection unit is formed on a semiconductor substrate K by suitable semiconductor fabrication techniques. A flexible film 1 is placed over the detection unit. The film 1 is made of a polyester or polyamide film having a thickness of about 10 μm. A conductive coating 2 covers the entire undersurface of the film 1, the coating having been applied by any suitable deposition technique, such as a sputtering method. The size of the output electrodes 5 is about 20 μm×200 μm. The coating 2 is grounded though the detection resistor 6. These elements may be somewhat similar to those shown in U.S. Pat. No. 5,079,949.

In finger print detector, as shown in FIG. 1, a finger F is lightly placed on the film 1 in order to depress the film in the finger print pattern. The conductive coating 2 on the undersurface of the film 1 is brought into selective contact with the output electrodes 5 of the semiconductor switching element, the points of contact being located below the depressed portions of film 1 which, in turn, are in contact with finger print ridges of the finger tip surface. In this state, the output electrodes 5 of the semiconductor switching elements are sequentially scanned to detect the potentials of the respective points on the conductive coating 2, as measured at the output terminal 7. This scan detects the finger print pattern.

Figure 2:
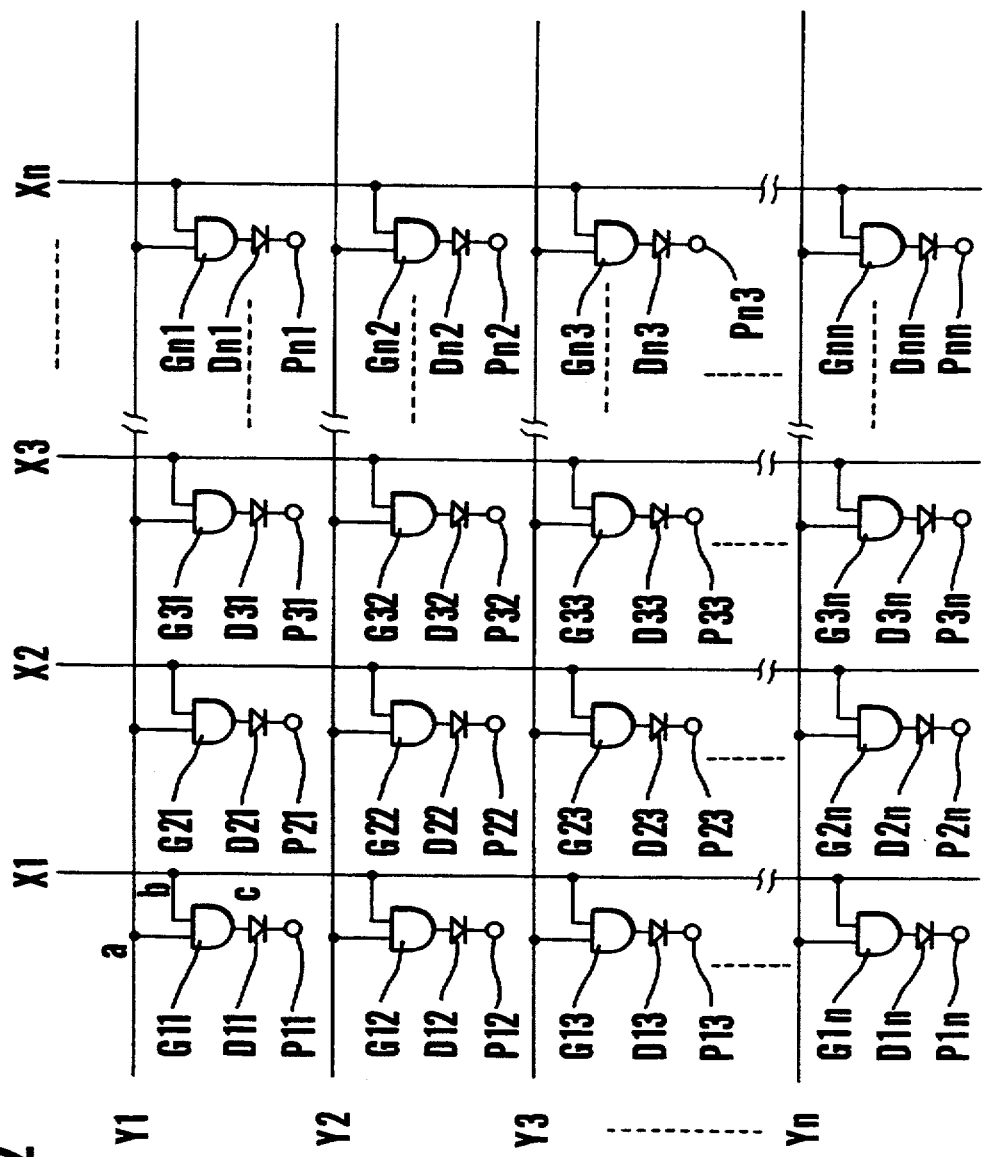
FIG. 2 is an electrical block diagram circuit of a detection matrix for use with a semiconductor matrix type of small-surface pressure distribution sensor of FIG. 1 when the detection unit has crosspoints comprising CMOS AND gates and the individual electrodes are output terminals.

The embodiment shown in FIG. 2 has a matrix of electronic switches that use diodes and AND gates made of CMOSFETS to form individual crosspoints which correspond to and are individually associated with the electrodes 5 (FIG. 1). The embodiment shown in FIG. 3 uses NPN bipolar transistors as switching elements. The embodiment shown in FIG. 4 uses n-channel MOSFETS. The embodiment shown in FIG. 5 uses NOR gates comprising CMOSFETS. Each embodiment represents a circuit for detecting a contact pressure at an intersection of horizontal and vertical busses, by detecting an output potential at an electrode Pxy (such as P11). If the conductive coating 2 (FIG. 1) engages an output electrode, it receives a signal from an AND gate Gxy (such as G11) in order to determine the X and Y addresses of the pressure point.

The detection unit of the embodiment shown in FIG. 2 comprises an orthogonal array of busses Y1 . . . Yn and X1 . . . Xn forming crosspoints having 2-input, 1-output AND gates Gxy (such as G11) (x, y: 1 to n) which are arranged in a horizontal direction (Y direction) and in a vertical direction (X direction), there being a total number of n×n crosspoints.

Each AND gate is comprised of CMOSFETS. Each crosspoint also includes diode Dxy (such as D11) (x, y: 1 to n) connected in series with the AND gate Gxy. The matrix of AND gates Gxy and diodes Dxy is formed as an integrated circuit on the semiconductor substrate K (FIG. 1). Input terminals of all the AND gates Gxy are identified by a and b, and the output terminals thereof are identified by c. The output terminal c of each AND gate Gxy is connected to the anode of the corresponding diode Dxy. The cathodes of all the diodes Dxy are connected to corresponding output terminal electrodes Pxy (such as P11) (x, y: 1 to n), respectively. Each AND gate Gxy is a gate having an output terminal c set at a high voltage "1" when both of the input terminals a and b are set at "1": where "1"=5 V and "0"=0 V. If the conductive coating 2 of the finger 1 touches a terminal electrode at a time when its individually associated gate is switched on, the 5 V at the electrode may be detected, e.g. if terminal P11 is touched at a time when busses Y1, X1 are energized, an output current flows out of terminal P11.

The input terminals a of the n number of gates are arranged in the horizontal direction as shown in FIG. 2 and are connected to define common terminals as Y1, Y2, Y3,..., Yn. The input terminals b of the n number of gates are arranged in the vertical direction and are connected to define common terminals as X1, X2, X3,..., Xn.

Figure 3:
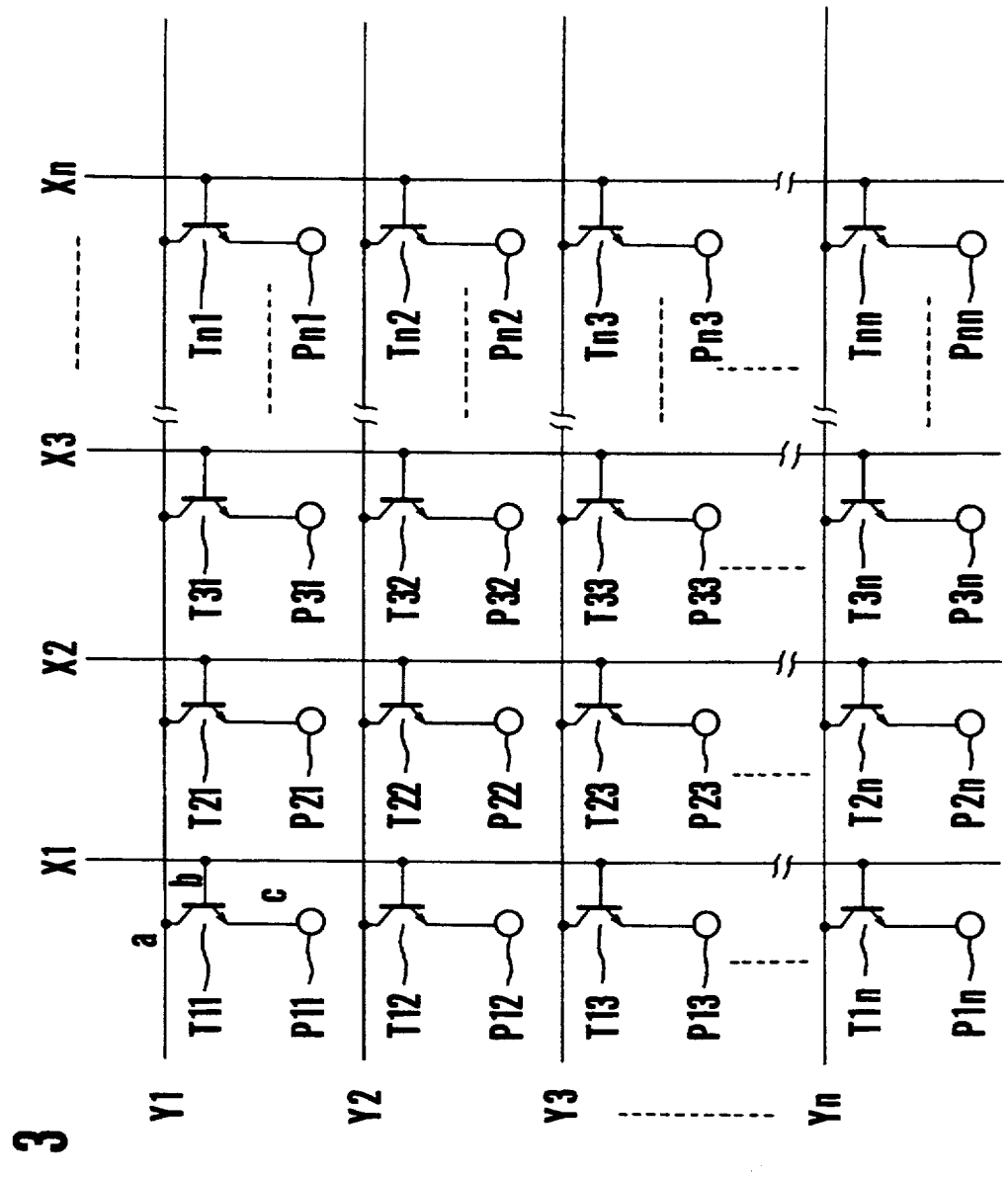
FIG. 3 is an electrical block diagram circuit of a detection matrix for use with a semiconductor matrix type of small-surface pressure distribution sensor of FIG. 1 when the detection unit has crosspoints comprising NPN bipolar transistors and the individual electrodes are input terminals.

The detection unit of the embodiment shown in FIG. 3 is arranged so that the semiconductor crosspoint switching elements are constituted by NPN bipolar transistors, respectively. In a manner which is similar to the manner in the embodiment of FIG. 2, each crosspoint comprises an n number of NPN transistors Txy (such as T11) (x, y: 1 to n) which are arranged in a horizontal direction (Y direction) and an n number of NPN transistors Txy (x, y: 1 to n) which are arranged in a vertical direction (X direction) to form a matrix having an n×n number of crosspoints. Collector terminals a of the n number of transistors are connected to horizontal busses Y1, Y2,..., Yn. Base terminals b of the n of the transistors are connected to define common vertical busses X1, X2,..., Xn. Note reference symbols Pxy (such as P11) (x, y: 1 to n) denote input terminals respectively connected to emitter terminals c of the transistors Txy.

When the conductive coating 2 on the film 1 touches an electrode Pxy at a time when the busses at that intersection are properly energized, the individually associated crosspoint transistor switches "on" e.g. if electrode P11 is at ground when busses Y1, X1 are properly energized, transistor T11 switches "on".

Figure 4:
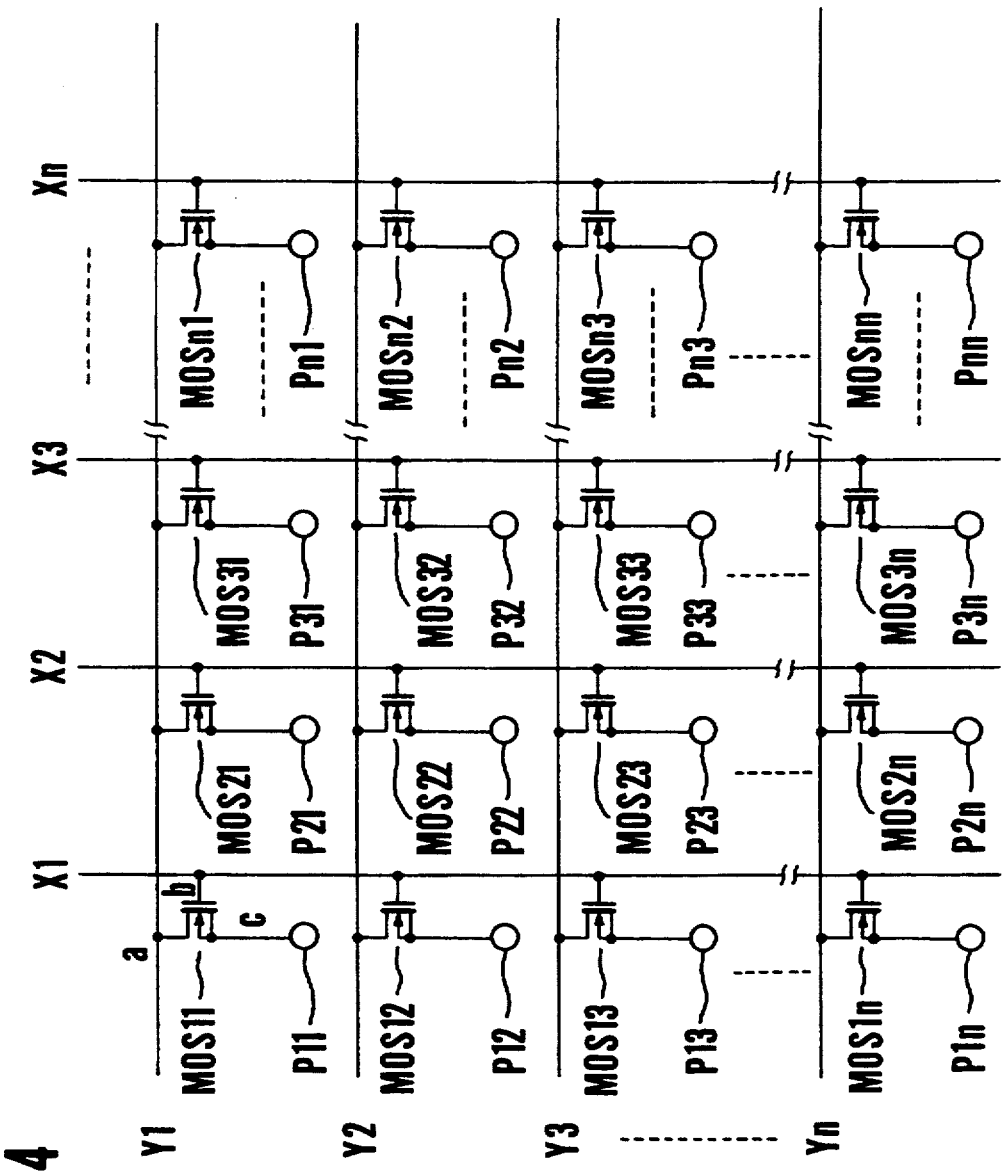
FIG. 4 is an electrical block diagram circuit of a detection matrix for use with a semiconductor matrix type of small-surface pressure distribution sensor of FIG. 1 when the detection unit has crosspoints comprising n-channel MOSFETS and the individual electrodes are input terminals.

The detection unit of the embodiment shown in FIG. 4 has crosspoints which use MOSFETs MOSxy (such as MOS11) (x, y: 1 to n) which are used in place of the NPN bipolar transistors in the embodiment shown in FIG. 3.

Drain terminals a of the n number of MOSFETs are arranged in a horizontal direction and are connected to common busses Y1, Y2,..., Yn. Gate terminals b of the n number of MOSFETs arranged in the vertical direction are and are connected to common busses as X1, X2,..., Xn. Note that source terminals c of the MOSFETs MOSxy are connected to terminal electrodes Pxy (such as P11) (x, y: 1 to n), respectively.

Figure 5:
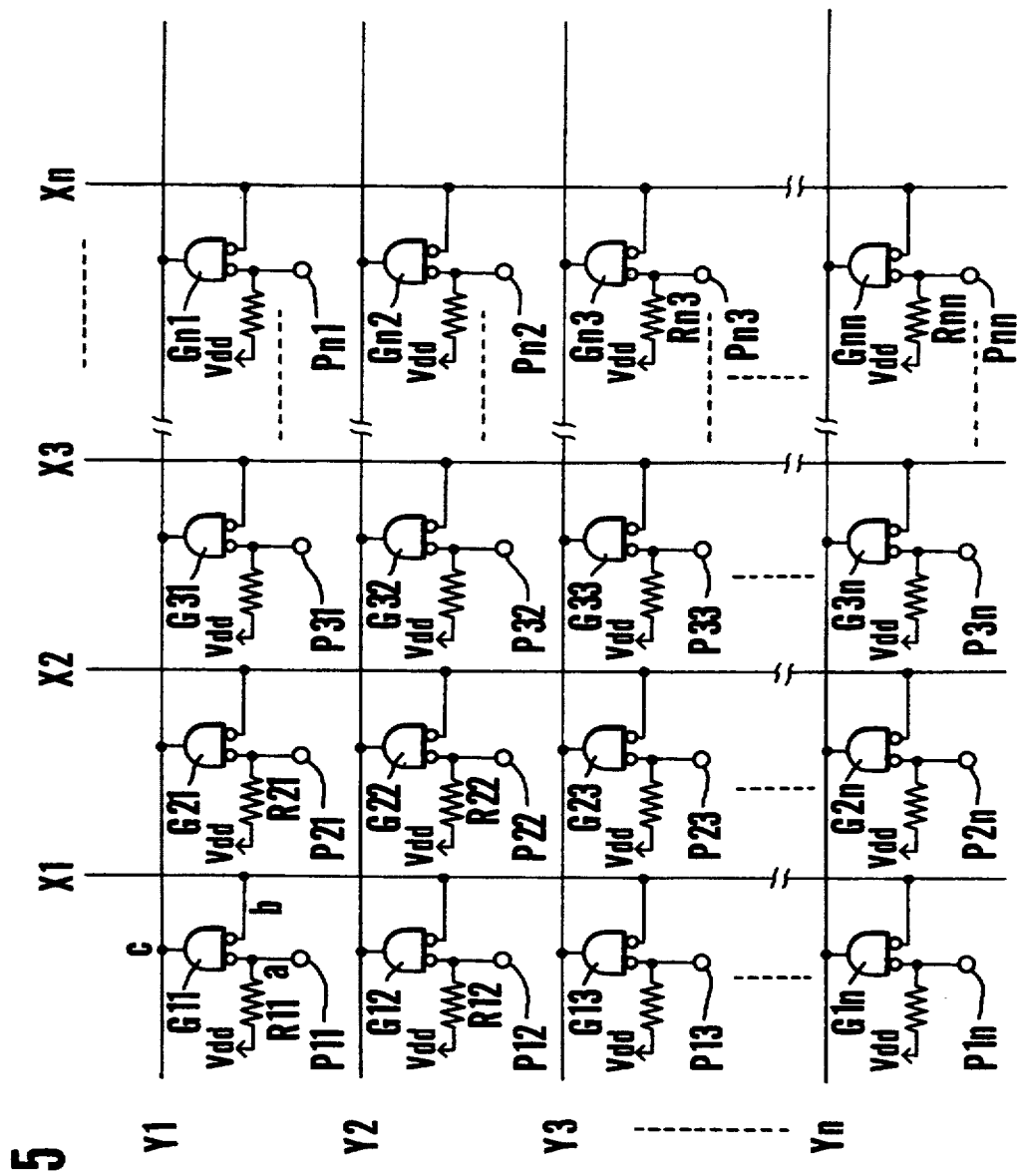
FIG. 5 is an electrical block diagram circuit of detection matrix for use with a semiconductor matrix type small-surface pressure distribution sensor of FIG. 1 when the detection unit has crosspoints using CMOS NOR gates and the individual electrodes are input terminals.

The detection unit of the embodiment shown in FIG. 5 uses CMOS NOR gates Gxy (such as G11) (x, y: 1 to n) having open-drain outputs. An input terminal a, b of the two inputs of each NOR gate Gxy is pulled up by an arbitrary resistor Rxy (such as R11) (x, y: 1 to n) connected to a power source Vdd. Terminals b of the n number of NOR gates Gxy are arranged in a vertical direction and are connected to define common terminals X1, X2,..., Xn. Electrode terminal c of the n number of NOR gates Gxy are arranged in a horizontal direction and are connected to define common terminals as Y1, Y2,..., Yn.

Figure 6:
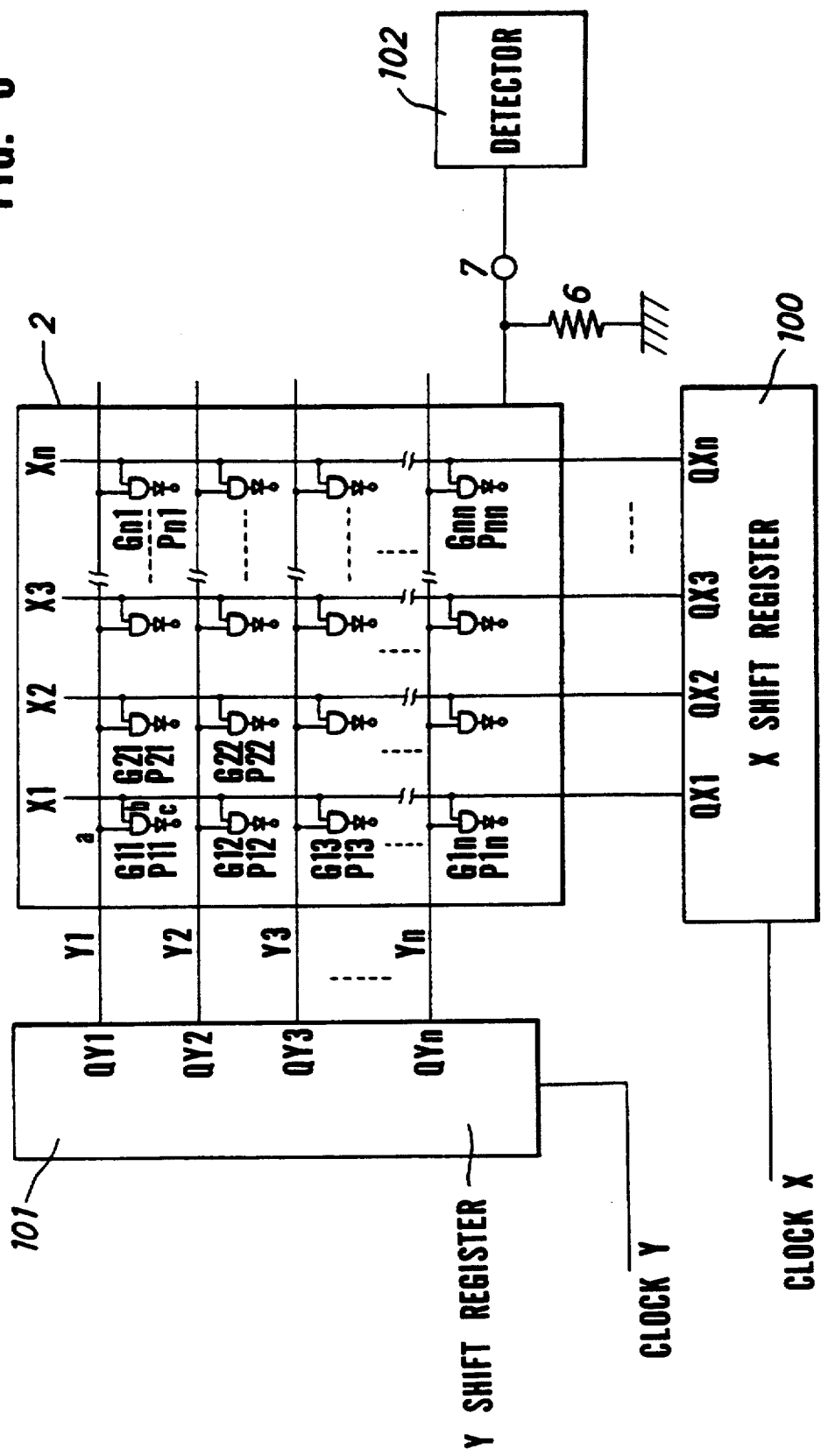
FIG. 6 is a block diagram of a system using the semiconductor matrix type small-surface pressure distribution sensor of FIG. 1 in combination with the FIG. 2 electrical matrix.

FIGS. 6 and 7 include X shift register 100; and Y shift register 101, each of which is driven from a suitable source of clock pulses. A detector 102 is coupled to detect when and where a ridge in a finger print pattern presses conductive film 2 against a terminal Pxy at a time in the shift register scan when the associated crosspoint is enabled. In FIG. 6, current from a shift register 100, 101 flows through a switched on and conductive gate Gxy and coating 2 on film 1 pressed against terminal Pxy to ground via resistor 6. Detector 102 detects a voltage change at the top of resistor responsive to this current flow. In FIG. 7, detector 102 detects when current flows from shift resister 101 through a conducting transistor Txy and a terminal Pxy to ground on conductive coating 2 of film 1 while it is pressed against a terminal Pxy.

In greater detail, FIG. 6 is a block diagram of a system employing the detection unit shown in FIG. 2 to provide an electrical circuit for detecting the output of a finger print sensor of FIG. 1.

The common vertical terminals X1, X2,..., Xn of the electronic matrix detection unit shown in FIG. 2 are connected to an X shift register 100. The common horizontal terminals Y1, Y2,..., Yn of the electronic matrix detection unit are connected to a Y shift register 101. A detector 102 is connected to the output terminal 7 which, in turn, is electrically connected to the conductive coating 2.

In operation, assume that a voltage of 5 V is applied through an output terminal QY1 of the Y shift register 101 to horizontal bus Y1, that the remaining output terminals QY2 to QYn are set at 0 V, and further that a voltage of 5 V is sequentially applied to each of the vertical busses, one at a time, from output terminals QX1 to Qxn of the X shift register 100. Under these assumptions, a voltage of 5 V is sequentially output at each of the output terminals P11 to Pn1 of the semiconductor switching elements in gates Gxy.

At this time, the film 1 of the finger print sensor is depressed by the ridges forming the finger print at the tip of the finger F in FIG. 1. The conductive coating 2 formed on the undersurface of the film 1 is set in contact with a voltage at the output terminal 5 of the semiconductor switching element. This voltage appears at the detection terminal 7 connected to the conductive coating 2. There is a voltage drop across resistor 6 as its upper terminal goes from ground to 5 V. The resulting output voltage is measured by the detector 102 in the time period while gate terminals a, b are marked by the shift registers 100, 101. For example, when the output terminal P21 is brought into contact with the conductive coating 2, a voltage of 5 V is output to the detection terminal 7 at a time while the common terminal X2 is set at 5 V. That is, when the output terminals are being scanned from QX1 to Qxn while the detection terminal 7 is being monitored, each ridge in the finger print depresses a corresponding point on the conductive coating 2. Each such depressed point sends a signal from the corresponding output terminals P11 to Pn1, thus identifying corresponding ridges of the skin surface in terms of an address established by the scan of the shift registers.

In this case, pressure points in the Y2 row can be detected and identified. The same operation as described above is repeated at every Y terminal up to QYn in order to measure the finger print applied pressures at all the points.

Since the appropriate detection resistor 6 is connected between the detection terminal 7 and ground, a contact area can be identified by detecting the magnitude of current flowing through the detection resistor 6. When a pressure acting on each point on the sensor of FIG. 1 is increased, the contact area between coating 2 and a electrode terminal is also increased, accordingly. As the, contact pressure is increased, the contact resistance is decreased to increase the current flowing through the detection resistor 6.

Stated another way, the resistance value is changed not only as a result of pressure acting on each point of the sensor, but also as a result of the area of contact between coating 2 and an electrode terminal. For such a minute distribution as the points in the finger tip pattern, a change in the resistance value which is caused by the contact area is a very effective way to measure the minute distribution. That is, a fine resolution of the finger print pattern results from a discrimination of the pressure that is being detected.

FIG. 7 is a block diagram of an electrical system using another embodiment (FIG. 3) of a finger print sensor. The common vertical terminals X1, X2,..., Xn of the detection unit shown in FIG. 3 are connected to an X shift resister 100. The X shift register 100 performs the scanning by sequentially applying a voltage of 5 V to each of the terminals QX1 and QX2 responsive to clock X pulses. The common horizontal terminals Y1, Y2,..., Yn are connected to a Y shift register 101 via corresponding and individually associated resistors R1, R2,..., Rn. Shift register 101 is driven from clock Y. The conductive coating 2 is grounded through the load resistor 6. On their matrix side, the terminals of the resistors R1, R2,..., Rn are connected to a detector 102. Thus, if current flows through a resistor R1, R2,... Rn, there is a voltage drop which can be detected.

For example, assume that a finger print ridge on a skin surface brings conductive coating 2 into contact with the emitter terminal P22 of the transistor T22 while the Y shift register 101 is applying a +5 V voltage to a horizontal terminal QY2 and the X shift register 100 is applying a suitable bias to a vertical terminal X2.

The emitter terminal P22 is grounded through the conductive film 2 and the load resistor 6. A base current instantaneously flows in the base terminal of the transistor T22, which switches on. After the transistor T22 is turned on, a current flows from the Y shift register 101 through the resistor R2. As a result of the IR drop across resistor R2, the potential is changed on the detector side of the resistor R2. Thus, the detector 102 can detect a turn-ON operation of the transistor T22. That is, if a finger print ridge on the skin surface is in contact with an electrode 5 to apply ground from coating 2 to the emitter of the transistor T22, the ridge can be detected. Similarly, the detector 102 can detect all changes of potentials on the detection sides of the resistors R1, R2,..., Rn, in order to detect the finger print pattern.

When a detection unit 102 of a surface distribution sensor and its drive circuit are formed on a single chip, as described above, a large number of extraction electrodes need not be arranged in the X and Y directions, as compared with a case wherein the detection unit is individually connected to each matrix terminal. A minimum number of terminals can be provided to facilitate assembly, thereby obtaining a compact structure.

In each embodiment described above, when a flexible film receives a surface pressure, a conductive coating 2 is brought into contact with an electrode 5 of a semiconductor switching element in order to make an electrical contact therewith. The greater the pressure, the more the area in contact with electrode; therefore, an increase in contact area decreases the resistance at the point of contact. It is possible to obtain a value in terms of either a simple ON/OFF or of an analog-value representing a degree of contact pressure between the conductive coating and the output electrode, in responsive to a surface pressure applied to the flexible film.

Those who are skilled in the art will readily perceive how to modify the invention. Therefore, the appended claims are to be construed to cover all equivalent structures which fall within the true scope and spirit of the invention.

I claim:

1. An analog finger print reader comprising a semiconductor matrix of surface pressure distribution sensors having a plurality of semiconductor crosspoint switching elements formed on a semiconductor substrate, a field of partially exposed electrodes on said semiconductor substrate, each of said electrodes being individually associated with a corresponding one of said switching elements, a flexible film suspended over said field of electrodes, said flexible film having a conductive coating formed on a surface thereof which confronts said field of electrodes, said flexible film being deflected and said conductive coating being placed in a varying degree of electrical contact with some of the electrodes at positions corresponding to a pattern of surface pressure applied to said film by ridges and valleys on a finger tip, said degree of contact being dependent upon the amount of pressure applied to said electrical contact, contact resistances being formed between the conductive coating of the contacted electrodes, said contact resistance having a resistance value which varies with the degree of contact between the conductive coating and the electrode, measuring means comprising X- and Y-direction shift registers and detector means formed on said semiconductor substrate, means responsive to said shift registers for sequentially generating addresses of said electrodes in order to scan said electrodes in said field, means responsive to said addresses for extending a circuit through an addressed electrode to said detector means, and said detector means detecting said resistance values as analog values corresponding to said degree of pressures applied at said positions where said conductive coating is pressed into contact with said electrodes.

2. The reader of claim 1 wherein said measuring means measures the voltage level at said contact between said conductive coating and an electrode in order to detect the surface pressure distribution in terms of analog values.

3. The reader according to claim 1, wherein said electrodes are orthogonally arranged in a matrix formed on a major surface of a semiconductor chip, the distribution of said output electrodes being located at very small pitches in the range of about 10 to 200 μm.

4. The reader according to claim 1, wherein each of said contacts between said conductive coating and said electrodes form a variable resistance, said detector means detecting an analog voltage level at each of said contact means.

5. The reader according to claim 1, wherein said contact between said conductive coating and said electrodes form a variable resistance for limiting current as an analog of said surface pressure applied by said finger tip, said analog current being applied as an input to said electrodes and to said switching elements.

6. An electronic finger print reader comprising an integrated circuit chip, said integrated circuit comprising means for scanning an array of electrodes which are individually associated with electronic switching elements formed in an area on said chip corresponding to at least an area of a finger print, there being enough of said switching elements within said area to read a pattern of ridges and valleys in said finger print, each of said switching elements having an individually associated one of said electrodes at least partially exposed above a surface of said chip, a thin film having a conductive surface suspended over said electrodes, the ridges of said finger print pressing said conductive surface against individual ones of said electrodes to make contact therewith on a basis selected by the amount of contact between the ridges in said finger print and the individual electrodes touched by said ridges, the area of said contact between said conductive surface and said electrode being an analog value of the pressure applied by a ridge to an electrode, whereby the resistance across said contact varies with variations of said applied pressure, means responsive to said contact between said electrodes and said conductive surface for applying said potential to operate those of said switching elements which are individually associated with a contacted electrode, means for applying a source potential to said operated contact via a resistor so that the voltage drop across said resistor varies with the variations in resistance across said contact, detector means formed on said integrated circuit chip, said detector means being connected to said resistor to detect the voltage level resulting from said voltage drop, and means responsive to said scanning means for detecting an address of each operated one of said switching elements and for effectively applying said voltage level corresponding to said operated switching element to said detector means.

7. The reader of claim 6 wherein said detector means formed on said semiconductor chip reads signals which said scanning means sends to said electronic switching elements.

8. The reader of claim 6 wherein said resistor is connected to said conductive surface, said detector means being connected to detect said voltage drop across said resistor responsive to current flow through an electronic switch when it turns on responsive to said conductive surface being pressed against an electrode.

9. The reader of claim 6 wherein said resistor is connected between each output of said scanning means and an input to said electronic switching elements, and said detector means is connected to detect said voltage drop across said resistors when an electronic switch operates responsive to said conductive surface touching an electrode individually associated with said operated switch.

10. A semiconductor device comprising a semiconductor substrate having an integrated circuit thereon, said integrated circuit having an orthogonal array of horizontal and vertical buses forming a matrix of crosspoints, a first shift register means coupled to said horizontal busses and a second shift register coupled to said vertical busses for scanning said crosspoints, a resilient conductive film stretched over said electrodes, said film selectively touching said electrodes in response to minute pressures, the area of contact between said touching film and said electrode being a function of pressure applied through said film to said electrode, whereby a resistance measured across said contact is an analog of the applied pressure, and detector means for detecting an address of a crosspoint which is operated when scanned by said shift registers, said detector means giving an analog output signal responsive to the area of said contact.

* * * * *